(12) United States Patent  
Whitfield et al.

(10) Patent No.: US 8,789,963 B2  
(45) Date of Patent: Jul. 29, 2014

(54) COMPACT LED WORK LIGHT

(75) Inventors: Robert Tod Whitfield, Toronto (CA); Donald L. Klipstein, Upper Darby, PA (US); Jack Brass, Toronto (CA)

(73) Assignee: Brasscorp Limited, North York, ON (CA)

( * ) Notice: Subject to any disclaimer, the term of this patent is extended or adjusted under 35 U.S.C. 154(b) by 145 days.

(21) Appl. No.: 13/285,604

(22) Filed: Oct. 31, 2011

(65) Prior Publication Data

US 2012/0212944 A1   Aug. 23, 2012

Related U.S. Application Data

(63) Continuation-in-part of application No. 13/270,808, filed on Oct. 11, 2011, which is a continuation of application No. 12/458,018, filed on Jun. 29, 2009, now Pat. No. 8,033,681, which is a continuation of application No. 11/083,086, filed on Mar. 18, 2005, now Pat. No. 7,553,051, application No. 13/285,604, which is a continuation-in-part of application No. 12/289,782, filed on Nov. 4, 2008, which is a continuation of application No. PCT/CA2007/000802, filed on May 4, 2007, and a continuation-in-part of application No. 11/083,086.

(60) Provisional application No. 60/521,240, filed on Mar. 18, 2004, provisional application No. 60/521,680, filed on Jun. 16, 2004, provisional application No. 60/521,689, filed on Jun. 17, 2004, provisional application No. 60/521,738, filed on Jun. 28, 2004, provisional application No. 60/521,888, filed on Jul. 17, 2004.

(51) Int. Cl.  
*F21L 4/02* (2006.01)

(52) U.S. Cl.  
USPC ............... 362/184; 362/249.02; 362/109

(58) Field of Classification Search  
USPC ............ 362/184, 109, 120, 249.02, 249.05, 362/294, 373  
See application file for complete search history.

(56) References Cited

U.S. PATENT DOCUMENTS

| | | | |
|---|---|---|---|
| 7,281,820 B2 * | 10/2007 | Bayat et al. | 362/245 |
| 2002/0191396 A1 * | 12/2002 | Reiff et al. | 362/246 |
| 2010/0302773 A1 * | 12/2010 | Kokoski et al. | 362/231 |

\* cited by examiner

*Primary Examiner* — Bao Q Truong

(57) ABSTRACT

A work light having a work light body including handle section and light head section, an elongate housing, a battery compartment and a component chamber longitudinally aligned within the housing, a battery, an LED circuit board assembly extending longitudinally within the housing and having a substrate layer, an external component layer on a first side of the substrate layer, and a driving component layer on an opposing second side of the substrate layer. Overlapping portion of the LED circuit board assembly in close proximity to the battery. Also, at least one LED on the external component layer, the external component layer facing transaxially outwardly from the housing such that light emitting from the LED emits from the light head section. At least one driving component on the driving component layer, all driving components placed on an extending portion of the LED circuit board assembly over the component chamber.

13 Claims, 12 Drawing Sheets

COMPACT LED WORK LIGHT

CROSS-REFERENCE TO RELATED APPLICATIONS

This application is a continuation in part of U.S. patent application Ser. No. 13/270,808 filed Oct. 11, 2011 which is a continuation of U.S. Pat. No. 8,033,681 issued Oct. 11, 2011 which is a continuation of U.S. Pat. No. 7,553,051 issued Jun. 30, 2009 which claims the benefit of the filing date of U.S. patent application No. 60/521,240 filed Mar. 18, 2004, Application No. 60/521,680 filed Jun. 16, 2004, Application No. 60/521,689 filed Jun. 17, 2004, Application No. 60/521,738 filed Jun. 28, 2004, and Application No. 60/521,888 filed Jul. 17, 2004 under the title LED Work Light. This application is also a continuation in part of U.S. patent application Ser. No. 12/289,782 which is a continuation of PCT/CA2007/000802 filed May 4, 2007 which is a continuation in part of U.S. Pat. No. 7,553,051 issued Jun. 30, 2009 which claims the benefit of the filing date of U.S. patent application No. 60/521,240 filed Mar. 18, 2004, Application No. 60/521,680 filed Jun. 16, 2004, Application No. 60/521,689 filed Jun. 17, 2004, Application No. 60/521,738 filed Jun. 28, 2004, and Application No. 60/521,888 filed Jul. 17, 2004 under the title LED Work Light. The content of the above applications is hereby expressly incorporated by reference into the detailed description hereof.

FIELD OF THE INVENTION

The application relates to work lights. More particularly it relates to LED work lights.

BACKGROUND OF THE INVENTION

Work lights, often known as "trouble lights", are widely used in automotive repair shops and other repair settings and construction settings. Such work lights are often in a form that can alternatively be handheld or hung from a suitable elevated object such as a raised automobile hood.

Incandescent work lights have been in use, but they have some drawbacks. Incandescent work lights can be hot to the touch. Also, work lights are all too often dropped or knocked down and fall onto a hard surface, and this often results in breakage of an incandescent bulb or its filament. An additional drawback of incandescent work lights is a safety hazard that results from the possibility of the bulb breaking with its hot filament in close proximity to flammable material such as spilled flammable liquid if the work light suffers a fall.

Fluorescent work lights exist and they have advantages over incandescent work lights, namely greater energy efficiency and a reduced hazard of igniting flammable materials if they suffer a fall. However, fluorescent work lights can experience breakage of their bulbs if they suffer a fall. Although breakage of an operating fluorescent bulb is not as likely to ignite nearby flammable materials as breakage of an incandescent bulb is, there is still a slight chance that a fluorescent bulb can ignite adjacent flammable materials if broken while operating since fluorescent lamps normally have hot electrodes while they are operating. There are fluorescent work lights that have impact cushioning means included to increase their ability to survive falls, but they may experience breakage of their bulbs if they fall onto a hard surface.

LED work lights are better able to survive falls than are work lights that have glass bulbs. Furthermore, LEDs do not generally operate with parts hot enough to ignite flammable materials, so even falls that do result in breakage are less likely to cause fires than are similar falls of work lights that have glass bulbs.

LED work lights of increasing light intensity are relatively costly. LED work lights of increasing light intensity utilize LEDs that can produce sufficient heat to damage the LEDs or other circuitry. Battery operated LED work lights can have limited run times and can be fairly large.

As described further herein some features of some aspects of the invention will address some of the issues raised above. Other features and other aspects will address other issues with existing LED lights to provide alternatives or improvements thereto.

SUMMARY OF ASPECTS OF THE EMBODIMENTS

In a first aspect embodiments can provide a work light having a work light body. The work light body includes a handle section and a light head section, an elongate housing extending through the handle section and the light head section, a battery compartment and a component chamber longitudinally aligned within the housing, a battery within the battery compartment, an LED circuit board assembly extending longitudinally within the housing and having a substrate layer, an external component layer on a first side of the substrate layer, and a driving component layer on an opposing second side of the substrate layer, wherein an overlapping portion of the LED circuit board assembly is placed in close proximity to the battery over the battery compartment, at least one LED on the external component layer, the external component layer facing transaxially outwardly from the housing such that light emitting from the LED emits from the light head section, and at least one driving component on the driving component layer, all driving components on the driving components layer placed on an extending portion of the LED circuit board assembly that extends from the overlapping portion over the component chamber.

Close proximity can be less than the depth of at least one driving circuit component in the driving circuit layer. Close proximity can be less than the depth of all driving circuit components in the driving circuit layer.

The work light can have a lens assembly over the LED circuit board assembly, the lens assembly including a lens over each LED.

The substrate layer can be formed of a thermally conductive material, and the substrate can be in thermal contact with the housing, and the housing can be a heatsink formed of thermally conductive material.

The work light body can also include a charging port for receiving external power to the work light body, dual mode circuitry within the external component layer and driving circuit layer to charge the battery from the charging port when receiving external power through the charging port, and to power the LED when the work light is receiving power from the charging port and when the work light is not receiving power from the charging port, and a tether port about the charging port, and, the work light can also include a power cable assembly comprising a power cable, a charging port connector at a first end of the power cable, the charging port connector compatible with the charging port to provide power through the power cable to the work light body, and a tether port connector about the charging port connector at the first end of the power cable. The tether port connector is compatible with the tether port to provide a manually operable tether connection between the power cable assembly and the work light body. The tether connection is such that the work light body is mechanically restrained by the power cable assembly when tether connected, and the charging port and charging port connector are maintained connected when the work light body and power cable assembly are tether connected.

In a further aspect embodiments can provide a work light comprising a work light body including a handle section and a light head section, an elongate housing extending through the handle section and the light head section, an LED circuit board assembly having a substrate layer and an external component layer on a side of the substrate layer, the substrate layer formed of a thermally conductive material, the substrate layer is in thermal contact with the housing, and the housing is a heatsink formed of thermally conductive material, andl at least one LED on the external component layer, the external component layer facing transaxially outwardly from the housing such that light emitting from the LED emits from the light head section.

A layer of the LED circuit board assembly other than the substrate layer can be between the substrate layer and the housing, such layer can be electrically resistive with low thermal resistance. The substrate can be formed of metal and the LED circuit board assembly can be a metal core LED circuit board assembly.

The housing can be a single-piece unit. The housing can include longitudinal grooves trapping longitudinal edges of the substrate layer to hold the substrate layer in thermal contact with the housing.

The work light can have a driving component layer on an opposing side of the substrate layer, and at least one driving component on the driving component layer.

In another aspect embodiments can provide a work light including a work light body comprising, a handle section and a light head section, at least one LED facing such that light emitting from the LED emits from the light head section, a charging port for receiving external power to the work light body, a battery to power the LED, dual mode circuitry to charge the battery from the charging port when receiving external power through the charging port, and to power the LED when the work light is receiving power from the charging port and when the work light is not receiving power from the charging port, and a tether port about the charging port. The work light can further include a power cable assembly comprising a power cable, a charging port connector at a first end of the power cable, the charging port connector compatible with the charging port to provide power through the power cable to the work light body, and a tether port connector about the charging port connector at the first end of the power cable. The tether port connector is compatible with the tether port to provide a manually operable tether connection between the power cable assembly and the work light body. The tether connection is such that the work light body is mechanically restrained by the power cable assembly when tether connected, and the charging port and charging port connector are maintained connected when the work light body and power cable assembly are tether connected.

The tether port and tether port connector can include a threaded projection and a threaded cap. The charging port and charging port connector can include an electrical plug and socket.

The work light can have an electrical plug on a second end of the power cable for connection to an external power source. The power cable assembly can have a cord reel about which the power cable is reeled.

Other aspects of the invention including for example methods of use will be evident from the detailed description hereof.

BRIEF DESCRIPTION OF THE DRAWINGS

For a better understanding of the present invention and to show more were clearly how it may be carried into effect, reference will now be made, by way of example, to the accompanying drawings which show the embodiments in which.

DETAILED DESCRIPTION OF EXAMPLE EMBODIMENTS

Figure 1:
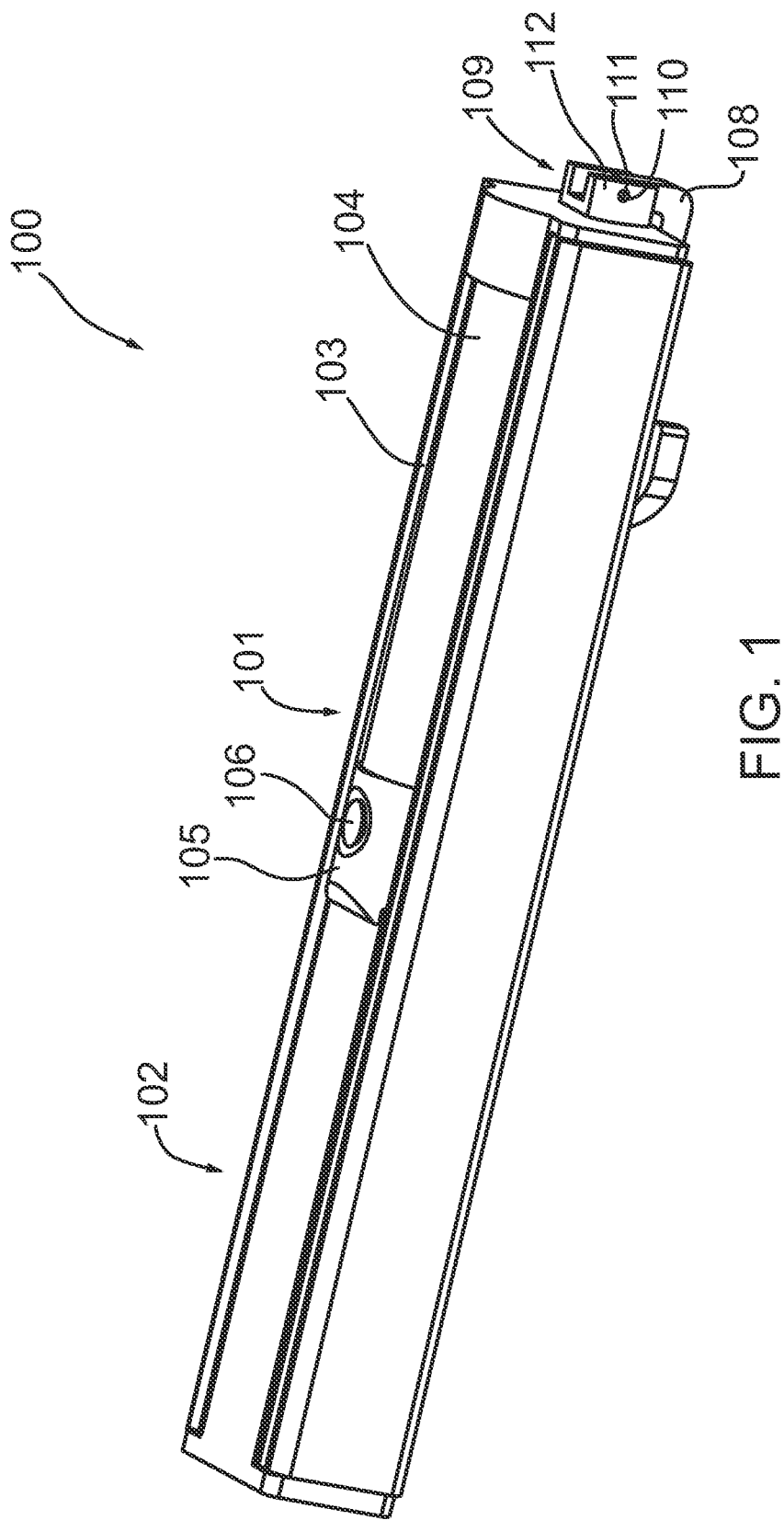
FIG. 1 is a perspective view of an example embodiment of an LED work light.

Referring generally to the FIGS. various embodiments of LED work lights are shown.

For example, an embodiment has a work light having a work light body. The work light body includes a handle section and a light head section, an elongate housing extending through the handle section and the light head section, a battery compartment and a component chamber longitudinally aligned within the housing, a battery within the battery compartment, an LED circuit board assembly extending longitudinally within the housing and having a substrate layer, an external component layer on a first side of the substrate layer, and a driving component layer on an opposing second side of the substrate layer, wherein an overlapping portion of the LED circuit board assembly is placed in close proximity to the battery over the battery compartment, at least one LED on the external component layer, the external component layer facing transaxially outwardly from the housing such that light emitting from the LED emits from the light head section, and at least one driving component on the driving component layer, all driving components on the driving components layer placed on an extending portion of the LED circuit board assembly that extends from the overlapping portion over the component chamber.

Close proximity can be less than the depth of at least one driving circuit component in the driving circuit layer. Close proximity can be less than the depth of all driving circuit components in the driving circuit layer.

The work light can have a lens assembly over the LED circuit board assembly, the lens assembly including a lens over each LED.

The substrate layer can be formed of a thermally conductive material, and the substrate can be in thermal contact with the housing, and the housing can be a heatsink formed of thermally conductive material.

The work light body can also include a charging port for receiving external power to the work light body, dual mode circuitry within the external component layer and driving circuit layer to charge the battery from the charging port when receiving external power through the charging port, and to power the LED when the work light is receiving power from the charging port and when the work light is not receiving power from the charging port, and a tether port about the charging port, and, the work light also has a power cable assembly comprising a power cable, a charging port connector at a first end of the power cable, the charging port connector compatible with the charging port to provide power through the power cable to the work light body, and a tether port connector about the charging port connector at the first end of the power cable. The tether port connector is compatible with the tether port to provide a manually operable tether connection between the power cable assembly and the work light body. The tether connection is such that the work light body is mechanically restrained by the power cable assembly when tether connected, and the charging port and charging port connector are maintained connected when the work light body and power cable assembly are tether connected.

In another embodiment a work light has a work light body including a handle section and a light head section, an elongate housing extending through the handle section and the light head section, an LED circuit board assembly having a substrate layer and an external component layer on a side of the substrate layer, the substrate layer formed of a thermally conductive material, the substrate layer is in thermal contact with the housing, and the housing is a heatsink formed of thermally conductive material, and at least one LED on the external component layer, the external component layer facing transaxially outwardly from the housing such that light emitting from the LED emits from the light head section.

A layer of the LED circuit board assembly other than the substrate layer is between the substrate layer and the housing, such layer can be electrically resistive with low thermal resistance. The substrate is formed of metal and the LED circuit board assembly can be a metal core LED circuit board assembly.

The housing is a single-piece unit. The housing has longitudinal grooves trapping longitudinal edges of the substrate layer to hold the substrate layer in thermal contact with the housing.

The work light has a driving component layer on an opposing side of the substrate layer, and at least one driving component on the driving component layer.

In another embodiment a work light has a work light body having a handle section and a light head section, at least one LED facing such that light emitting from the LED emits from the light head section, a charging port for receiving external power to the work light body, a battery to power the LED, dual mode circuitry to charge the battery from the charging port when receiving external power through the charging port, and to power the LED when the work light is receiving power from the charging port and when the work light is not receiving power from the charging port, and a tether port about the charging port. The work light has a power cable assembly comprising a power cable, a charging port connector at a first end of the power cable, the charging port connector compat-ible with the charging port to provide power through the power cable to the work light body, and a tether port connector about the charging port connector at the first end of the power cable. The tether port connector is compatible with the tether port to provide a manually operable tether connection between the power cable assembly and the work light body. The tether connection is such that the work light body is mechanically restrained by the power cable assembly when tether connected, and the charging port and charging port connector are maintained connected when the work light body and power cable assembly are tether connected.

The tether port and tether port connector has a threaded projection and a threaded cap. The charging port and charging port connector have an electrical plug and socket.

The work light can have an electrical plug on a second end of the power cable for connection to an external power source. The power cable assembly can have a cord reel about which the power cable is reeled.

Additional details of these and other embodiments will now be described.

Referring to FIG. 1, a work light 100 has work light body 101 having a handle section 102 and a light head section 103. The light head section 103 has a transparent cover 104 through which light is emitted from the work light 100.

A switch enclosure 105 encloses a switch cover 106. The switch cover 106 is malleable and allows actuation of a switch 107 (see FIG. 2 for example) to control the emission of light from the head section 103 of the work light 100. For example, the switch cover 106 may be formed from rubber.

A hook 108 extends from the work light body 101. The hook 108 is mounted to the work light body 101 to provide a rotatable mount 109 to allow the hook 108 to lay flat against the work light body 101 when the hook 108 is not in use. For example, the hook 108 can lay flat against the head section 103. As shown in the FIGS., the mount 109 provides pin 110 extending transaxially from the hook 108 into holes 111 in opposing plates 112 extending axially away from the work light body 101.

In addition to allowing for rotation against and away from the work light body 101, the rotatable mount 109 can allow for additional degrees of freedom for the hook 108. For example, the rotatable mount 109 can itself be mounted to the work light body 101 such that the mount 109 can rotate about an axis of the work light body 101. For example the plates 112 can be mounted on an axial pin 113 (FIG. 3), extending into the work light body 101 on an axis aiming through the head section 103 and the handle section 102. Other mounts, not shown, could be used, such as a universal ball and socket joint. Such a hook 108 and mount 109 can provide a great deal of versatility and utility for hands-free positioning of the work light 100. Although hands-free positioning of a work light can be desirable, it is not necessary to provide a means for hands-free positioning of the work light 100 in order to take advantage of all the features described herein for work lights.

Figure 2:
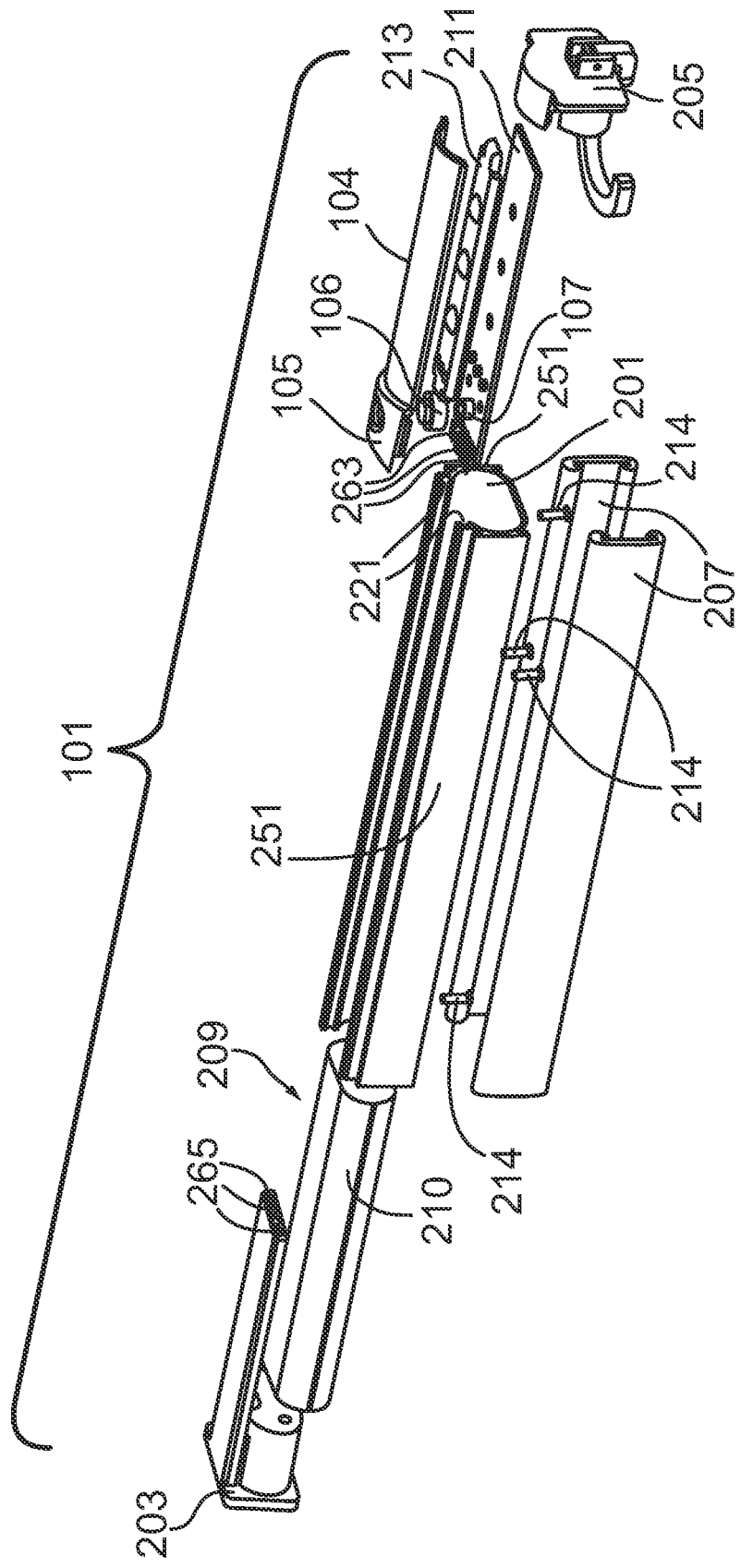
FIG. 2 is an exploded perspective view of the LED work light of FIG. 1.

Referring to FIG. 2, the work light body 101 has a housing 201, end caps 203, 205, bumpers 207, battery 209, LED circuit board assembly 211, lens assembly 213, switch cover 106, switch enclosure 105, and transparent cover 104. Various screws 214 are employed to fix element of the work light 100 to the housing 201, such as the end caps 203, 205.

Figure 3:
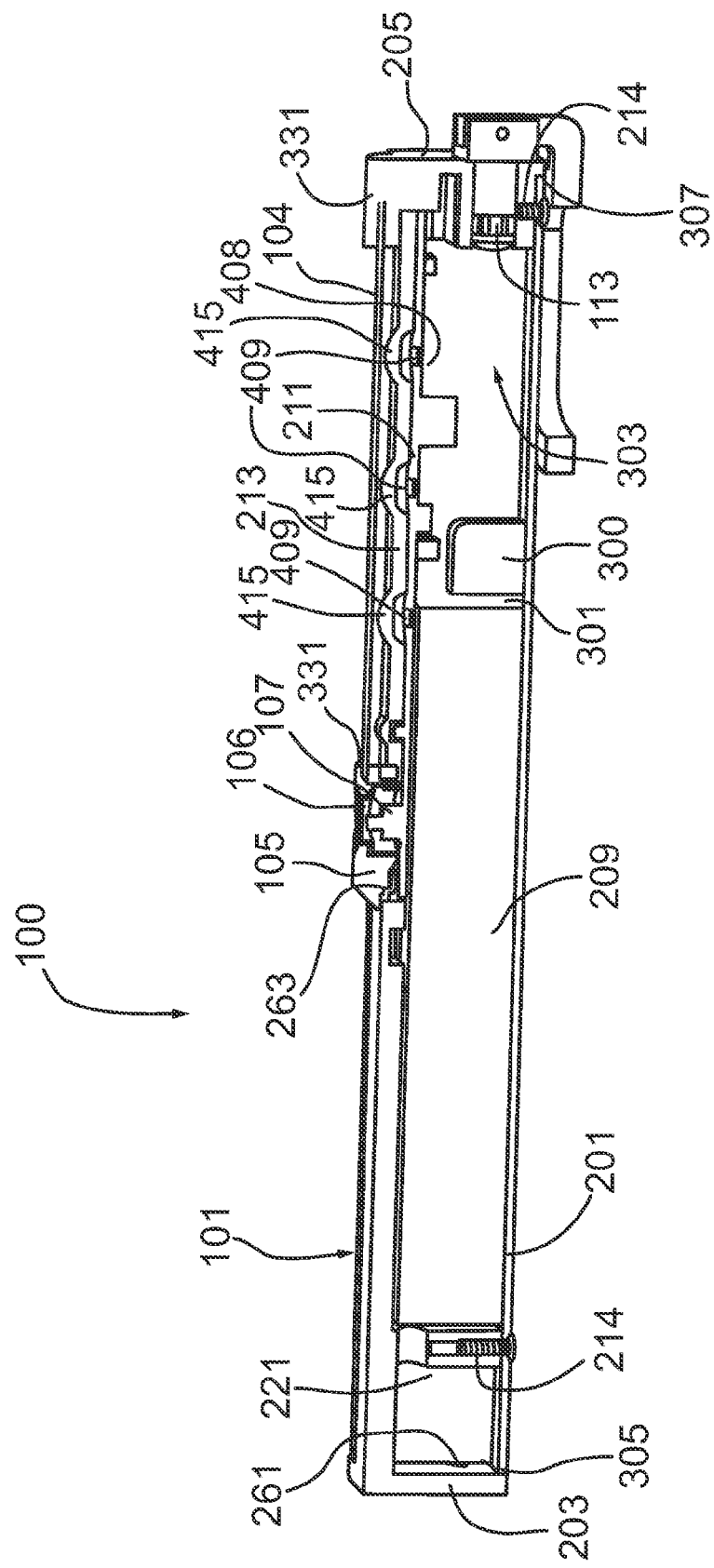
FIG. 3 is a longitudinal cross-section of the work light of FIG. 1.

Referring to FIG. 3, the work light 100 has a battery compartment 301, substantially filled by battery 209, and a component chamber 303. The battery compartment 301 and component chamber 303 are longitudinally aligned within the housing 201. Opposing ends 305 and 307 of the housing 201 are enclosed by the end caps 203, 205. The battery compartment 301 and component chamber 303 are between the end caps 305, 307.

In the embodiments shown in the FIGS. herein the housing 201 is a rigid elongate single-piece construction. For example, the housing 201 can be formed from an extrusion process. Alternative embodiments of the housing are possible where the end caps 203, 205, or portions thereof, are also incorporated into the housing 201 in a single piece construction with the battery inserted transaxially into the housing and moved into a battery compartment rather than through an end of the housing. As necessary other manufacturing processes such as moulding may be used.

In the FIGS the battery 209 is shown as a single unit. The battery 209 can comprise multiple battery cells and associated terminals and wiring, not independently shown, packaged in a plastic wrap 210, preferably shrink-wrap, to form a single unit as is known to those skilled in the battery art. As shown, in the FIGS, battery cells are arranged into a battery 209 side-by-side and longitudinally to form an elongate battery 209 having an obround axial cross-section. A battery 209 could be formed from a single cell, or from separate cells not packaged as a single unit.

Referring to FIG. 3, battery 209 is in the battery compartment 301. LED circuit board assembly 211 has a substrate layer 401 between an external component layer 403 and a driving circuit layer 405. Components 406 requiring external interaction, such as switch 107 and LEDs 409 are mechanically and electrically connected on to the external component layer 403, such as by solder; while, driving circuitry components 407 are mechanically and electrically connected to the driving circuit layer 405, such as by solder.

By placing components 407 that do not require external interaction on the driving circuit layer 405, rather than on the external component layer 403, the overall length of the LED circuit board assembly 211 can be reduced.

In addition, components 406, 407 on both the layers 403 and 405 can generate heat. Dividing the components 406, 407 between the layers 403 and 405 can allow for less heat build-up.

The circuit board assembly 211 longitudinally overlaps the battery 209 and extends over the component chamber 301. While the external components 406 are spread over the length of the LED circuit board assembly 211, the driving circuit components 407 on the driving circuit layer 405 are placed on that portion 408 of the driving circuit layer 405 that extends over the component chamber 301 such that the components 407 are provided with some air circulation to dissipate heat from the components 407. The driving circuit components 207 are in fluid communication with the chamber 301. By overlapping the LED circuit board assembly 211 and the battery 209, the overall length of the work light can be reduced, while allowing for needed battery size for sufficient operating time between battery charges.

The components 407 can also extend into the chamber 301. By placing the components 407 such that the components extend into the chamber 301, the substrate layer 401 can be brought into close proximity to the battery 209. Bringing the substrate layer into close proximity with the battery 209 can reduce the overall girth of the work light.

It is recognized that space on the external component layer 403 is particularly limited about the LEDs 409 when aligning a lens assembly 213 immediately adjacent the external component layer 403 for manipulation of light emanating from the LEDs 409. The lens assembly is held in alignment by keys projecting into keyways in the end cap 205 and the switch enclosure 105. The switch enclosure is held in pace with respect to the LED circuit board assembly 211 and, thus, LEDs 409 by pins extending from the switch enclosure 105 into holes 451 in the LED circuit board assembly. The end cap 205 holds the LED circuit board assembly in place from longitudinal outward movement.

The housing 201 has opposing longitudinal grooves 221 which retain the LED circuit board assembly 211, switch cover 105 and transparent cover 104 for other than longitudinal movement. The switch cover 105 and transparent cover 104 are held together in the grooves 221.

The switch cover 105 and end cap 205 have respective opposing curved slots 331 to receive the transparent cover 104.

The housing 201 could have alternate configurations. For example, The housing 201 could entirely enclose the battery 209 in cross-section while leaving the component chamber 301 open to the LED circuit board assembly 211.

There is a corresponding lens 415 in the lens assembly 213 place forward of each LED 409. The concavo-convex lens of U.S. patent application Ser. No. 13/370,808 (continuation of Ser. No. 12/458,018) discussed in particular with regard to FIG. 11 thereof has been found to be particularly efficient and to provide a particularly uniform beam, and reference is made to that FIG. and the related description which are incorporated by reference in the detailed description herein. The concavo-convex lens of U.S. patent application Ser. No. 12/289,782 discussed in particular with regard to FIG. 2 is shown as an individual lens having holes for mounting by screws. It is noted individual lenses 415 could also be mounted about the LEDs 409 by screws to the LED circuit board assembly 211, or other fastening means within the work light body 101. Example optics in place of the lenses 415 are described in U.S. patent application Ser. No. 13/370, 808 (continuation of Ser. No. 12/458,018) in particular with regard to FIG. 7 thereof, and reference is made to that FIG. and the related description which are incorporated by reference in the detailed description herein.

As shown in the FIGS., the housing 201 has an internal transaxial cross-section similar to an external transaxial cross-section of the battery 209 to retain the battery 209 from lateral movement in the housing 201. Preferably, the battery 209 has a non-circular cross-section such that the housing 201 also retains the battery 209 from rotation. The housing 201 can have alternate cross-sections different in shape from the cross-section of battery 209; however, the work light body 101 may be less compact. For example, the housing 201 might have a rectangular cross-section; while, the battery 209 is obround or cylindrical. Additional blocks or spacers, not shown, may be required to hold the battery 209 in place in such a housing.

As shown in the FIGS, the housing 201 forms a channel wall 225 extending about a substantial portion of the cross-section of the battery 209 to retain the battery. The transparent cover, switch enclosure, and a handle cover 226 extend across the channel wall 225 over the battery 209 to enclose the housing 201.

The battery 209 can be inserted into and removed from the housing 201 from a first end 217 of the housing 201.

Figure 4:
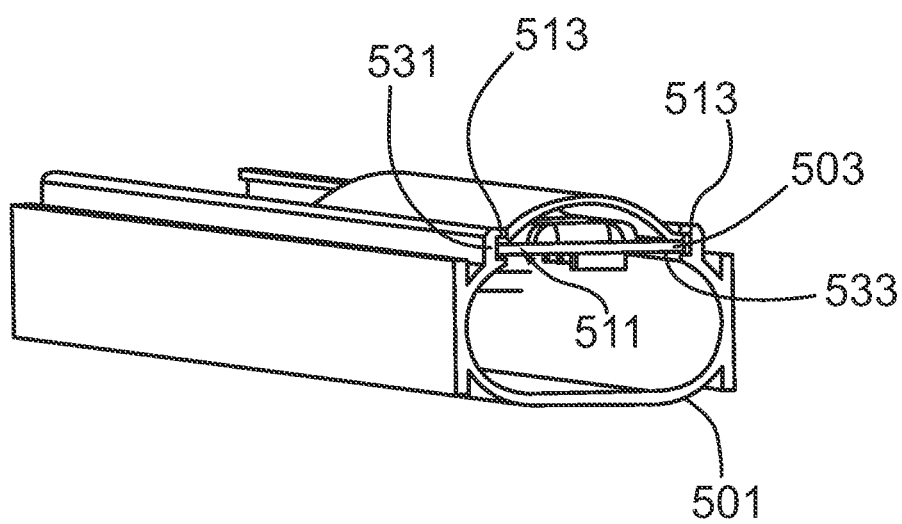
FIG. 4 is a perspective view of a perspective view of an alternative housing and LED circuit board assembly for use in an LED work light such as the LED work light of FIG. 1

Referring to FIG. 4, a housing 501, shown as similar to the housing 201, can be a heatsink, for example formed out of a metal such as aluminum. Aluminum provides a good combination of cost, weight, and thermal conduction parameters. Anodized aluminum can provide additional durability for protection against wear and tear. LEDs, particularly high power LEDs, can require independent heat sinking in addition to any heat sinking provided as part of the LEDs.

A substrate layer 503, shown as similar to the substrate layer 401 of the LED circuit board assembly 211, can be metal such that LED circuit board assembly 511 is a metal core LED circuit board assembly 511. The implementation of a work light utilizing housing 501 and assembly 511 can be otherwise similar to the work light 100, as such like reference numerals will be used for similar components and the description of such components will not be repeated.

The housing 501 holds substrate layer 503 in thermal contact with the housing 501. Other layers, such as layers 403, 405 of the metal core LED circuit board assembly 511 may be between the substrate layer 503 and the housing 501 provided the thermal resistance is sufficiently low and appropriate electrical resistance is provided between electrical layers and the housing 501.

Figure 5A:
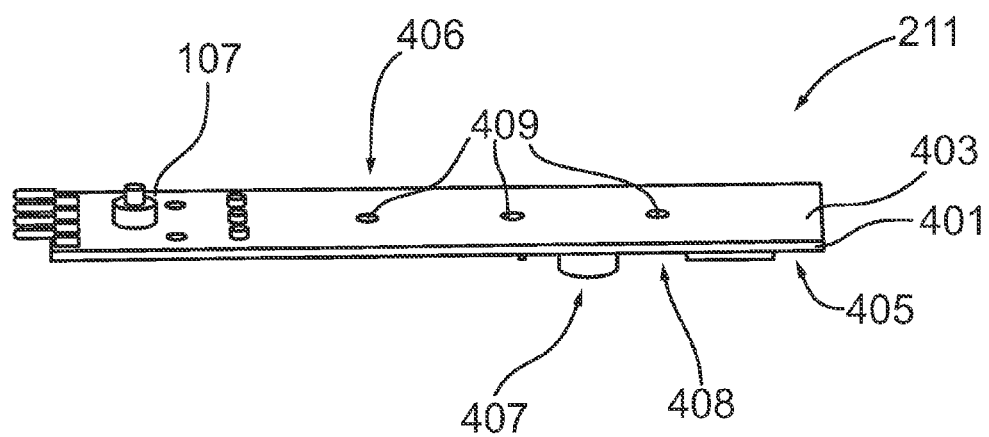
FIG. 5a is a perspective view of an example embodiment of an LED circuit board assembly of the work light of FIG. 1.
Figure 5B:
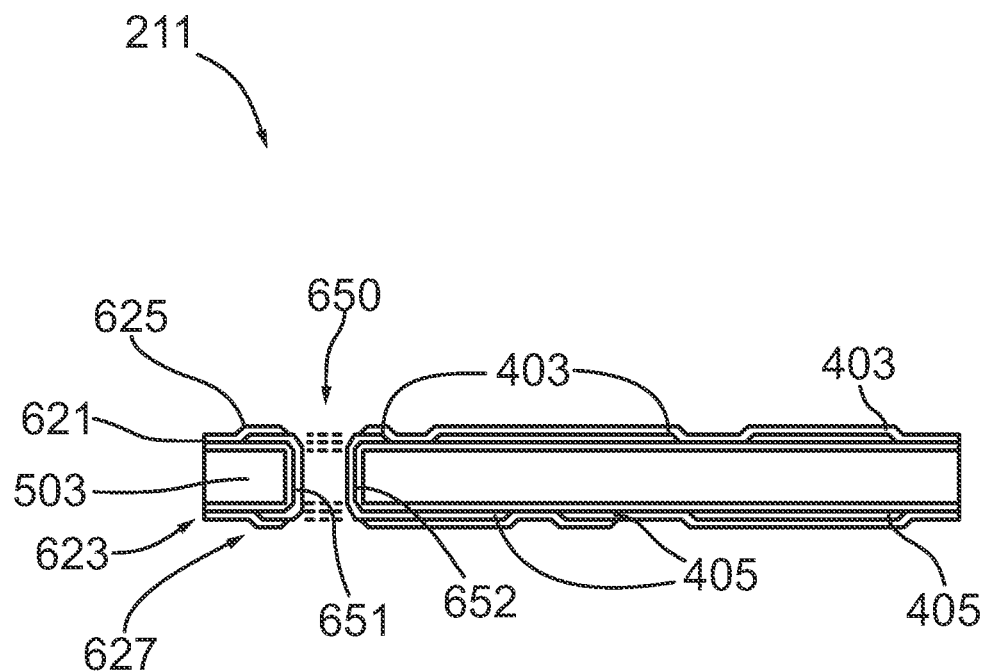
FIG. 5b is a detailed example longitudinal cross-section of a portion of a metal core printed circuit board which can be used in the LED circuit board assembly of FIG. 5a, FIG. 6 is a side view of another example embodiment of an LED work light.

Referring to FIGS. 5a and 5b, example board layers may include substrate layer 503, electrically insulating layers 621, 623 on either side of the substrate layer 503. Electrically insulating layers 621, 623 may be former from a material such as a polymer that is electrically insulating, while thermally conductive in thin layers. Circuit traces form external component layer 403 and driving component layer 405 on the insulating layers 621, 623. Further electrically insulating, thermally conductive layers 625, 627 cover the external component layer 403 and driving component layer 405, respectively. It may be most efficient to use a solder mask for the layers 625, 627. The solder mask can be left on after use in masking for application of solder to apply components to traces in the component layers 403, 405.

Connections between the external component layer 403 and the driving component layer 405 are typically accomplished by vias 650, which are conductive holes in the LED circuit board 211. A via 650 is shown as an example one in a metal core printed circuit board that is used for the LED circuit board 211. In a via 650, the external component conductive layer 403 and the driving component conductive layer 405 merge into each other as a conductive layer continuation 651.

Insulation of the conductive layers 403, 405, 651 from the metal substrate 503 is maintained by the insulating layers 621, 623 similarly continuing into each other through the via 601 as an insulating layer continuation 652. Maintaining insulation from the substrate 503 is necessary in order to avoid shorts between the conductive layers 651 of more than one via 601.

Referring again to FIG. 4, the substrate layer 503 can be held in thermal contact with the housing 501 by trapping opposing longitudinal edges 531, 533 of the substrate layer 503 in opposing longitudinal grooves 513 of the housing 501. Heat from the substrate layer 503 sinks into the housing 201. The substrate layer 503 in turn sinks heat from the components in the layers 403, 405. Independent heatsinks are particularly important for components such as high power LEDs.

LED circuit board assembly heatsinking to a work light housing can result in benefits in assembly. For example, using a housing 501 to both hold and draw heat through the substrate layer from the LEDs 409 can reduce complexity in manufacture and placement of a LED circuit board assembly 511.

LED circuit board assembly heatsinking to a work light housing can be applied to LED work lights, which do not utilize features of other embodiments described herein such as, for example, inline battery compartment and component chamber with overlapping LED circuit board assembly. Such LED work lights can include non-battery operated work lights. However, LED circuit board assembly heatsinking to a work light housing can provide synergistic benefits when applied in conjunction with features of other embodiments described herein such as, for example, inline battery compartment and component chamber with overlapping LED circuit board assembly. For example, other features described herein can provide compact LED work lights, which compact lights can further benefit from LED circuit board assembly heatsinking to a work light housing to draw away heat in a potentially compact manner.

Referring again to FIG. 2, the housing 201 incorporates rails 251 on either side of the housing 201 to which the bumpers 207 are attached. The bumpers 207 provide a comfortable grip to a user, while protecting the housing 201 and objects in the environment that the work light 100 may contact. The bumpers 207 can extend beyond the depth of the housing 201 to provide additional comfort and protection.

Referring to again to FIG. 3, a block 300 extends transaxially into the housing 201 to stop the battery from further longitudinal movement into the housing 201. The block 300 is fixed to the housing 201 by two screws 214. Other means may be used to fix the block 300 to the housing 201, such as glue. Alternatively, the block 300 may be formed within the housing as a single piece construction.

End cap 203 encloses first end 305 of the housing 201. The end cap 203 retains the battery 209 between the block 300 and the end cap 203 to restrict longitudinal movement of the battery within the housing 201. The end cap 203 has a terminal enclosure 221 providing terminals 261 for receiving external power for the battery 209. The battery 209 is also connected through the switch 107 to the LEDs 409 for illumination. Wiring connecting between externally accessible terminals 261 (one of which is visible in FIG. 3), the battery 209, and socket contacts 265 has been omitted for simplicity. Springs or spring loaded tabs, not shown, may be provided, for example on the block 300, to bias the battery 209 against the terminal enclosure 221 where simple contacts are used to make an electrical connection from the terminals 261 to the battery 209, and from the battery 209 to wiring for the LEDs 409. As will be known to those skilled in the art many other connection means may be used to connect electrical power from the terminal enclosure to the battery 209, such as springs or spring loaded tabs, not shown, for the contacts on the terminal enclosure 223, or wired connectors, not shown.

The terminal enclosure 221 is longitudinally aligned with the battery 209 and the component chamber at an opposing end of the battery 209. This placement of the battery 209 positions the battery 209 more centrally in the work light body 101 for balance purposes.

The terminals 261 can be used to provide external power to the LED work light 100 for charging the battery. The work light 100 may be placed in a charging station, not shown, for charging. Alternatively, the work light 100 may be provided with a charging port, such as a socket, not shown, to receive a charging plug on a power cord. An example of a suitable charging plug and socket combination is described with respect to work light 701 later herein.

Contacts 263 on LED circuit board assembly 211 and corresponding socket contacts 265 on end cap 203 are provided to electrically connect the battery 209 to the LED circuit board assembly 211.

Figure 6:
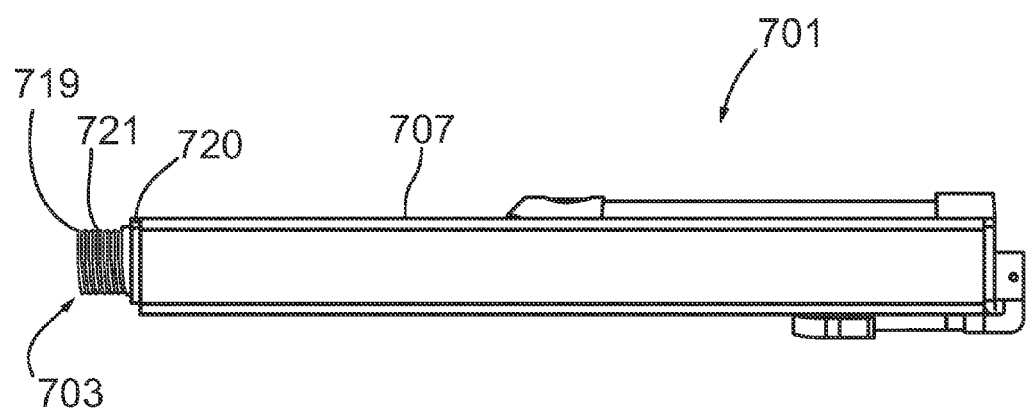
Figure 7:
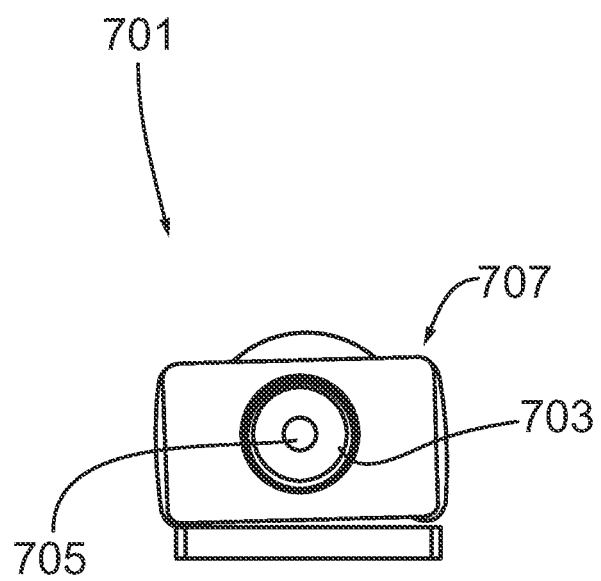
FIG. 7 is an end view of the LED work light of FIG. 6.

Referring to FIGS. 6 and 7, a dual-mode work light body 707 has a tether port 703 about a charging port 705.

Figure 8:
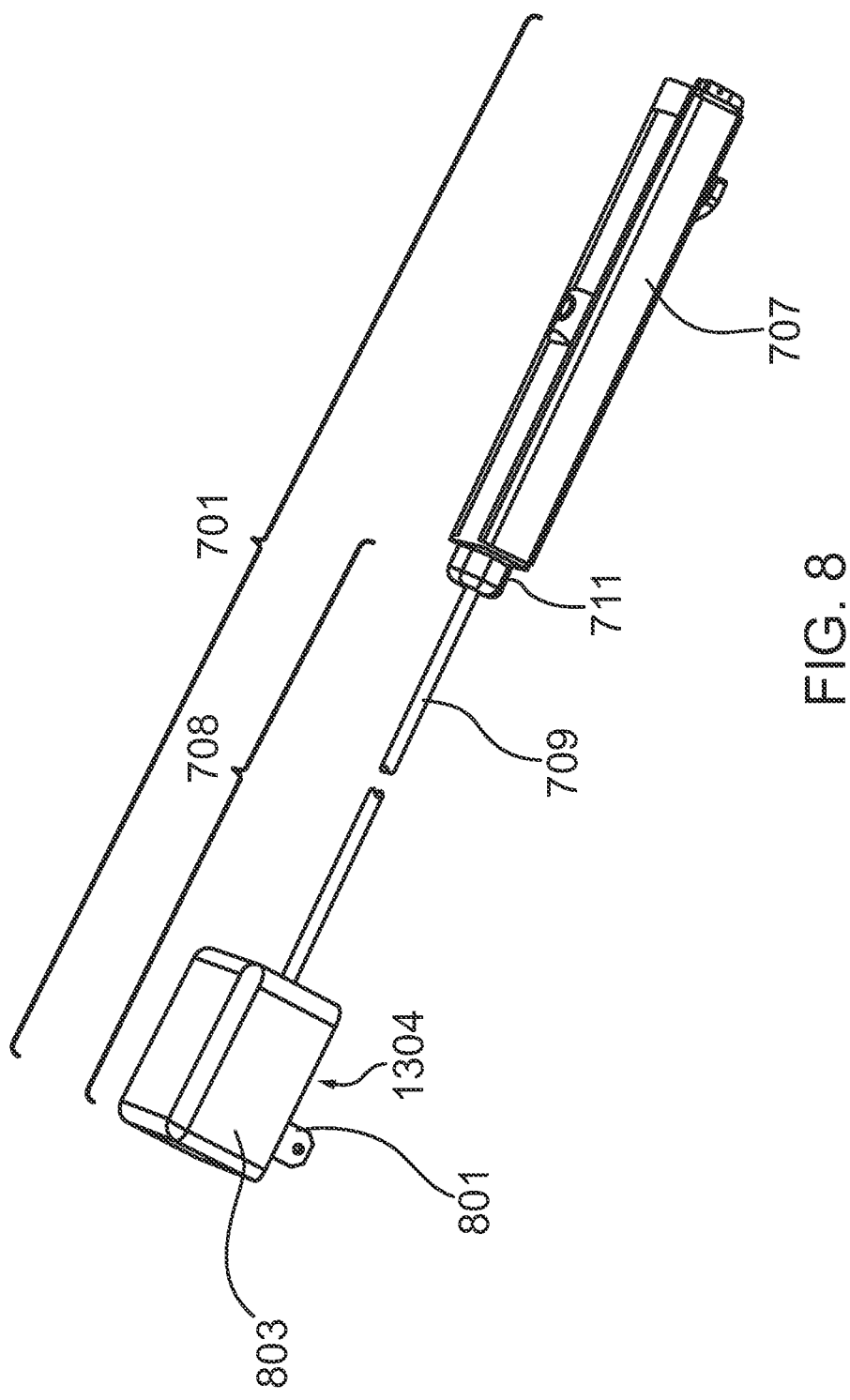
FIG. 8 is a perspective view of a example dual mode embodiment of an LED work light with a power cable tethered to a work light body.
Figure 9:
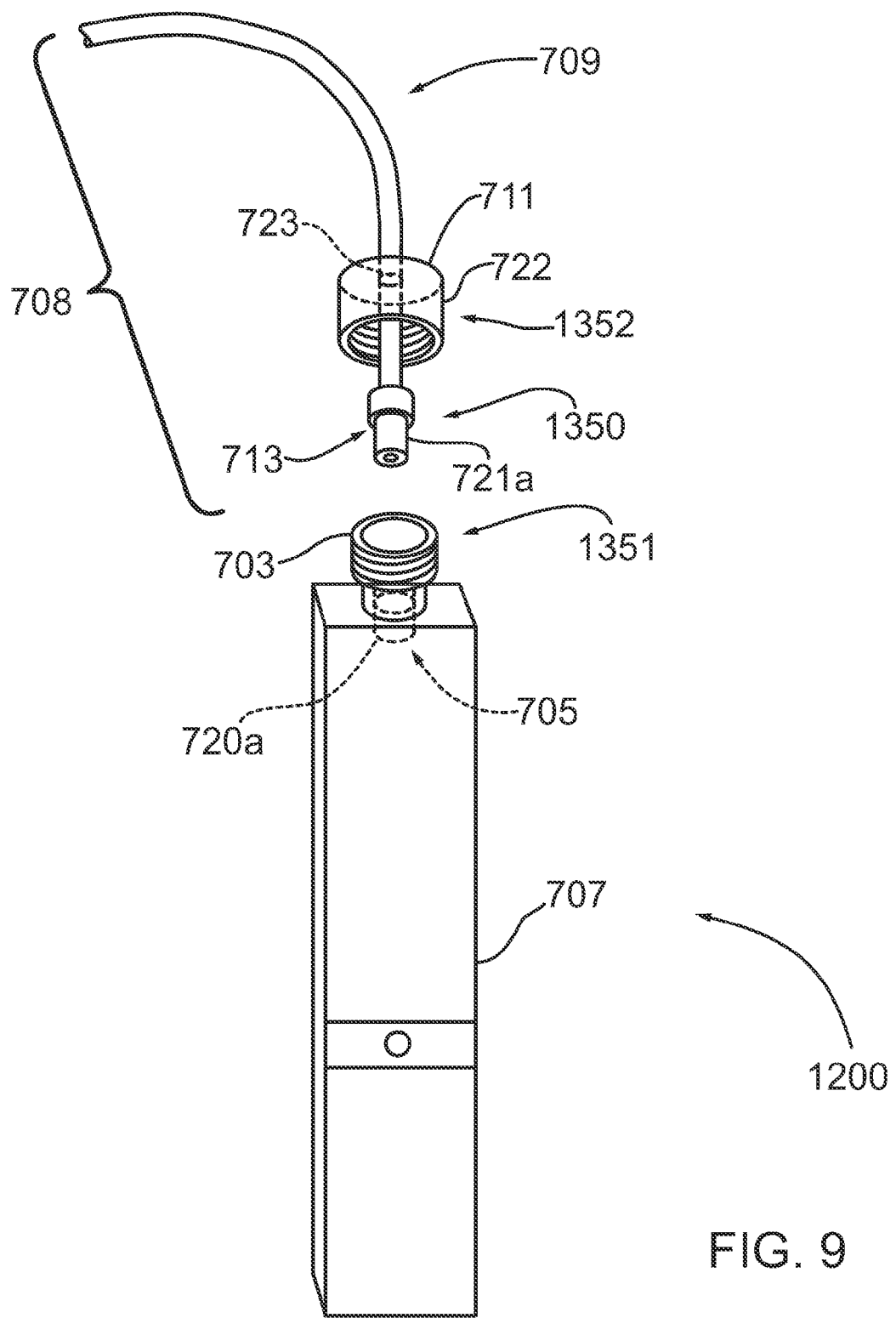
FIG. 9 is a perspective view of the LED work light of FIG. 8 with the power cable untethered from the work light body.

Referring to FIGS. 8 and 9, a work light 701 has work light body 707 and also has a power cable assembly 708 including a power cable 709 terminating at one end in a tether port connector 711 to engage the tether port 703 and in a charging port connector 713 to engage the charging port 705. The tether port 703 and the tether port connector 711 are a manually operable tether connection, while the charging port 705 and charging port connector 713 mate to form an electrical connection. A tether connection between the power cable assembly 708 and the work light body 707 is a mechanical restraint on the mobility of the work light body 707 such that the work light body 707 is retained from restrained from moving beyond the distance allowed by the power cable assembly 708.

For example, the tether port 703 can be a tubular projection 719 from end cap 720 about a charging port 705 that is an electrical charging socket 720*a*. The tubular projection 719 can have external threads 721. The charging port connector 713 can be a charging plug 721*a;* while the tether port connector 713 can be an internally threaded cap 722 having a hole 723 fitting about power cable 709. The hole 723 is of a smaller dimension than the plug 721*a* such that the cap 722 maintains the connection between the plug 721*a* and socket when the cap 722 is manually threaded to the tubular projection to tether the work light 701 to the cable 709 (FIG. 7). The cap 722 can be manually unthreaded to release the work light 701 from the cable 709 (FIG. 8).

The tether port 703 and tether port connector 711 form a mechanically durable connection to maintain the union when work light body 707 is tugged during use. Alternate example forms of connection may include a tether port and tether port connector having a bayonet mount configuration.

A manually operable tether connection in combination with a battery operated work light body 707 can enable untethered portable use of the work light body 707. This can be advantageous for use of the work light body 707 in locations remote from a power source, or locations where a power cable is inconvenient. As the work light 701 is dual mode, the work light 701 can be charging while tethered to maintain a full charge for portable use. Lithium ion batteries, and other batteries that do not suffer from memory effects, are particularly well suited to this application.

The features described herein can provide compact LED work lights, particularly heatsunk LED work lights, while allowing for batteries that can provide a full shift of illumination, for example 8-10 hours of portable use. A compact LED work light can have an even more compact work light body where a manually operable tether is used in locations that allow shorter durations of battery only power. This may be particularly true for tethered applications where the battery is charging while tethered and available for portable use fully charged. A tether can be particularly useful for smaller LED work lights that can be easily misplaced.

Referring to again to FIG. 8, the LED work light 701 is shown as receiving power through the power cable assembly 708 including the cable 709 and a plug 801 at an end of the power cable 709. The plug 801 plugs into an external power source, not shown. For AC external power source applications a power supply 1304 can be inline with the power cable 709 to step down and, possibly rectify and/or regulate, an external power source voltage to levels usable on an LED circuit board assembly 211 to charge batteries 209 and power LEDs 409. For example a switch mode power supply 803 can be used. The power supply can be integrated with the plug in a "wall wart" type power supply configuration.

Where the work light 701 is to be powered from a car or other external battery, the plug 801 can be an automotive DC plug, not shown, possibly including a DC-DC step down regulator.

Figure 10:
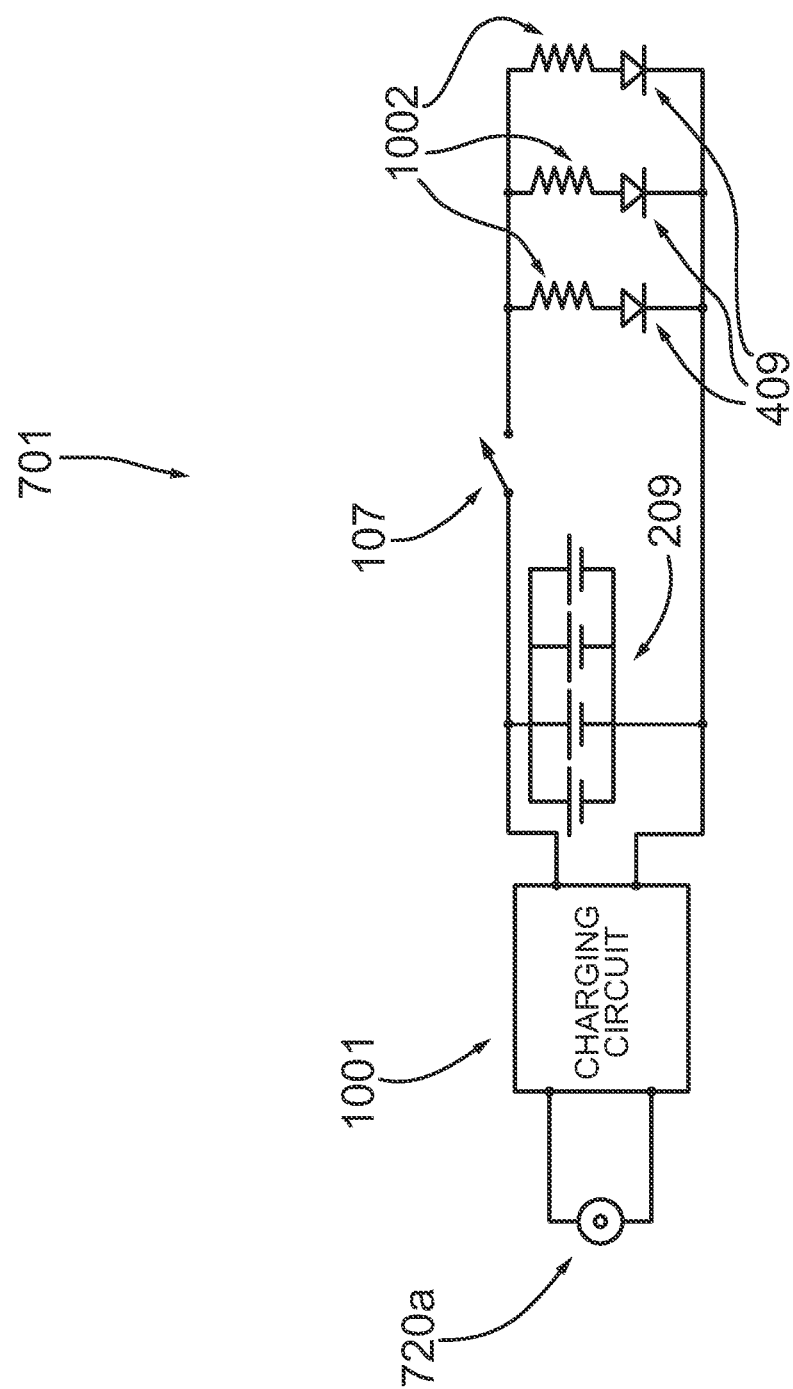
FIG. 10 is an example embodiment of an electrical circuit schematic diagram for use in the LED work light of FIG. 8.

Referring to FIG. 10, the work light 701 can have the electrical circuit shown with socket 720*a* connected to charging circuit 1001. Charging circuit 1001 is connected across battery 209 and the charging circuit is connected through switch 107 across LEDs 409 to both charge the battery 209 and drive the LEDs 409 from the socket 702*a* and from the battery 209. A similar electrical circuit can be used in other work light embodiments such as the work light 100.

Charging circuit 1001 can be provided on driving circuit layer 408 of LED circuit board assembly 211 can recharge batteries 209 while the LED work light 701 is in use while tethered. For example, the charging circuit 1001 may supply more current to the batteries 209 than the LEDs 409 draw from the batteries 209.

Charging circuit 1001 may, for example, include an application of Linear Technology Corporation of Milpitas, Calif. (www.linear.com) LTC4002 standalone battery charger integrated circuit, such as the application described with reference to FIG. 2 on page 14 of Linear Technology Corporation datasheet for LTC4002 (http://cds.linear.com/docs/Datasheet/4002f.pdf) showing a single cell li-ion battery charger. The content of the above datasheet is hereby incorporated by reference into this detailed description. To achieve greater magnitude of charging current for larger batteries (such as four single cell batteries each having a capacity of 2.2 amphours for use in driving three Luxeon Rebel LEDs 409 having a nominal power rating of three watts and operating at one watt each for eight to ten hours runtime between charges) than that achieved by the schematic shown in the above reference document, five components are changed. The resistance of the current sense resistor Rsense is decreased proportionately. The inductor L1 is changed to one having proportionally lower inductance than the one shown in the reference schematic, and increased current rating so as to be able to pass the increased current. The diodes D1 and D2 are changed to ones suitable for increased current, such as Schottky diodes rated for 2-3 amperes of current. The MOSFET transistor M1 is changed from the one specified in the reference document to one that is suitable for increased charging current, such as Fairchild NDT452AP or Zetex ZXMP3A16GTA.

The switch 107 is shown as able to switch the LEDs 409 on and off independently of use of the charging circuit 1001. Also shown are resistors 1002 associated with the LEDs 409 and limiting the amount of current drawn by the LEDs 409. Alternatively, an LED driving circuit may be used to control or regulate current flowing through the LEDs 409.

The thermal design of the LED work light 701, such as appropriate heatsinking and air mixing configurations, can be configured, for example employing the techniques described herein, to take into account any additional heat generation where LEDs 409 and charging circuit 1001 are both functioning. The charging circuit 1001 can be operated intermittently or at reduced capacity to reduce heat generation. Preferably, the charging circuit 1001 supplies sufficient current for the batteries 209 to gain charge or not lose charge while the charging circuit 1001 and the LEDs 409 are operated simultaneously. If desired, the charging circuit 1001 can be configured to recharge the batteries 209 more rapidly when the LEDs 101 are not in use.

An LED work light 701 being usually connected to the cable 709 while having rechargeable batteries 209 reduces the chance of the batteries 209 being completely discharged if the LED work light body 707 is taken to a location where batteries 209 cannot be recharged. If users of LED work light 701 become accustomed to keeping the work light body 707 tethered to power cable 709 whenever possible, the users would be less likely to leave the LED work light body 707 where the LED work light body 707 would get lost, for example, where the LED work light body 707 is used for doing work in a car that can be driven away while the LED work light body 707 remains in the car.

Figure 11:
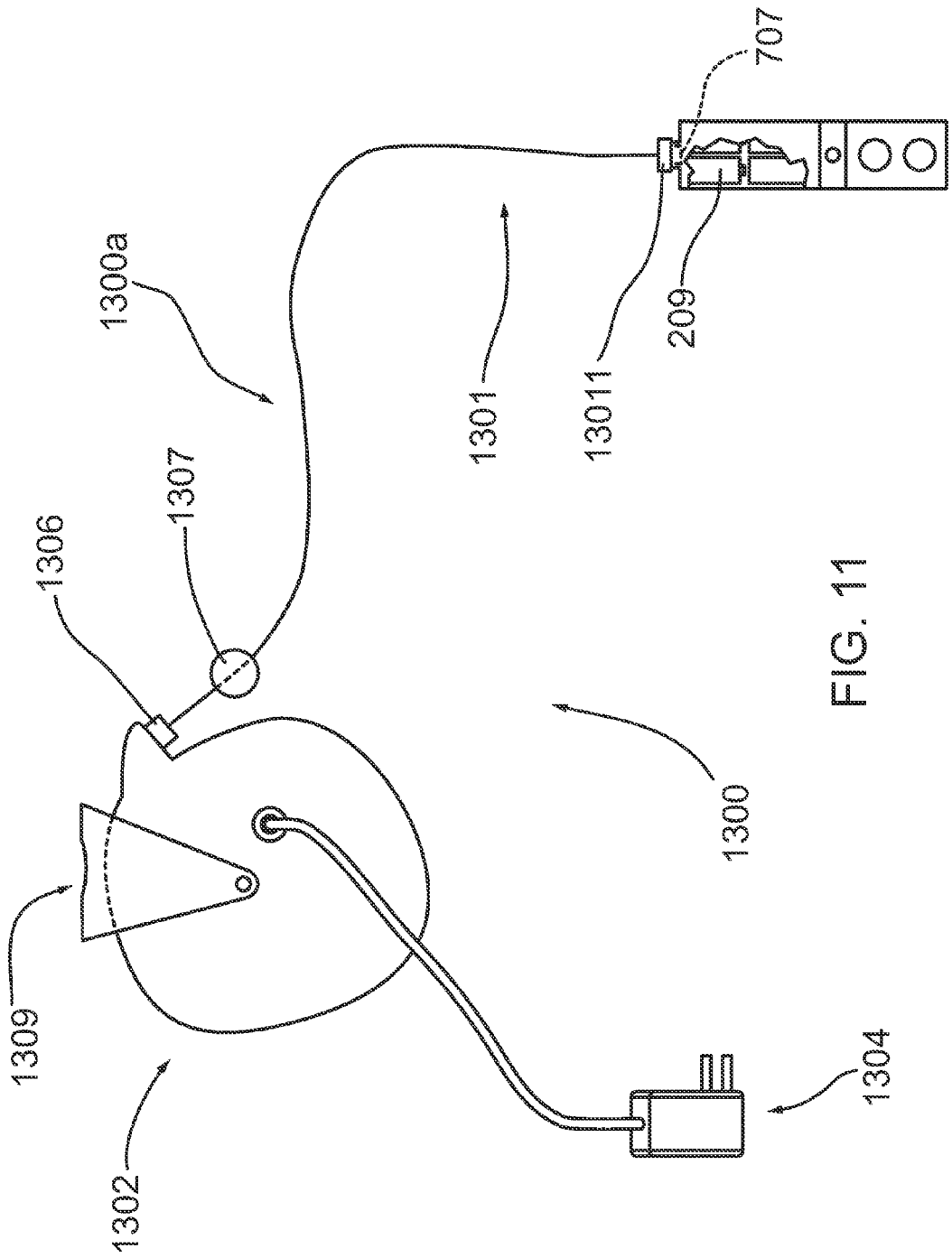
FIG. 11 is a further example embodiment of a dual mode LED work light.

Referring to FIG. 11, a work light 1300 can employ a cord reel power cable assembly 1300a in place of the power cable assembly 708 and together with the work light body 707. The arrangement of the LED work light body 707 and cord reel power cable assembly 1300a comprising cable 1301 and cord reel 1302 having a mounting bracket 1309 and a ball 1307 that can be slid along the cable 1301. The mounting bracket 1309 can be attached to a wall, ceiling, trolley, cart or other equipment. The ball 1307 fits sufficiently tightly on the cable 1301 so that it can limit retraction of the cable 1301 by the cord reel 1302. Limiting retraction of the cord 1301 by the cord reel 1302 can be useful, so that the LED work light body 707 is only retracted to a location that is reasonably clear of the work area but still within easy reach. The ball 1307 can be moved along the cable 1301 to adjust the amount of retraction of the cable 1301 when a user lets go of the LED work light body 707. A stop 1306 is provided to stop the ball 1307 from being retracted into the reel 1302. The stop 1306 may project from or be mounted on the cord reel 1302, but may alternatively be a hole in the housing of the cord reel 1302 that is smaller in width than the ball 1307. The ball 1307 may be substituted with an object of an alternative shape, such as a cylinder or a cube.

A cord reel power cable assembly 1300a reduces the possibility that the cable 1301 may come into contact with substances or objects that could damage the cable 1301. For example, work lights are often used in locations that have chemicals on the floor or moving objects, such as cars, that could damage the cable 1301 over time. Additionally, an operable tether, particularly a manually operable tether, can allow for separate replacement or interchange of either the power cable, cord reel, or work light body. This is particularly advantageous where the cost of the separate elements can be significant given the features discussed herein.

Dual mode tethering can be applied to battery operated LED work lights which do not utilize features of other embodiments described herein such as, for example, inline battery compartment and component chamber with overlapping LED circuit board assembly, or, as a further example, LED circuit board assembly heat sinking to a work light housing. However, dual mode tethering can provide synergistic benefits when applied in conjunction with features of other embodiments described herein such as, for example, inline battery compartment and component chamber with overlapping LED circuit board assembly, or, as a further example, LED circuit board assembly heat sinking to a work light housing. For example, other features described herein can provide compact LED work lights, particularly together with dual mode tethering, and such compact LED work lights that can be costly benefit from tethering to reduce the possibility of loss.

It will be understood by those skilled in the art that this description is made with reference to the preferred embodiment and that it is possible to make other embodiments employing the principles of the invention which fall within its spirit and scope as defined by the following claims. In particular and without limiting the above, persons skilled in the art will recognize that various features and functions of the different embodiments described herein will be useful in other embodiments, and that such features and functions may be used in such other embodiments to create new embodiments employing the principles of the invention.

We claim:

1. A work light comprising:
a work light body including,
   a handle section and a light head section,
   an elongate housing extending through the handle section and the light head section,
   a battery compartment and a component chamber longitudinally aligned within the housing,
   a battery within the battery compartment,
   an LED circuit board assembly extending longitudinally within the housing and having a substrate layer, an external component layer on a first side of the substrate layer, and a driving component layer on an opposing second side of the substrate layer, wherein an overlapping portion of the LED circuit board assembly is placed in close proximity to the battery over the battery compartment,
   at least one LED on the external component layer, the external component layer facing transaxially outwardly from the housing such that light emitting from the LED emits from the light head section, and
   at least one driving component on the driving component layer, all driving components on the driving components layer placed on an extending portion of the LED circuit board assembly that extends from the overlapping portion over the component chamber.

2. The work light of claim 1 wherein close proximity is less than depth of at least one driving circuit component in the driving circuit layer.

3. The work light of claim 1 wherein close proximity is less than depth of all driving circuit components in the driving circuit layer.

4. The work light of claim 1 further comprising a lens assembly over the LED circuit board assembly, the lens assembly including a lens over each LED.

5. The work light of claim 1 wherein:
the substrate layer is formed of a thermally conductive material, and the substrate is in thermal contact with the housing, and the housing is a heatsink formed of thermally conductive material.

6. The work light of claim 1 wherein:
the work light body further comprises:
   a charging port for receiving external power to the work light body,
   dual mode circuitry within the external component layer and driving circuit layer to charge the battery from the charging port when receiving external power through the charging port, and to power the at least one LED when the work light is receiving power from the charging port and when the work light is not receiving power from the charging port,
   and
   a tether port about the charging port,
and,
the work light further comprises:
   a power cable assembly comprising,
      a power cable,
      a charging port connector at a first end of the power cable, the charging port connector compatible with the charging port to provide power through the power cable to the work light body, and
      a tether port connector about the charging port connector at the first end of the power cable, the tether port connector compatible with the tether port to provide a manually operable tether connection between the power cable assembly and the work light body, the tether connection such that the work light body is mechanically restrained by the power cable assembly when tether connected, and the charging port and charging port connector are maintained connected when the work light body and power cable assembly are tether connected.

7. A work light comprising:
a work light body including,
  a handle section and a light head section,
  an elongate housing extending through the handle section and the light head section,
  an LED circuit board assembly having a substrate layer and an external component layer on a side of the substrate layer, the substrate layer formed of a thermally conductive material, the substrate layer is in thermal contact with the housing, and the housing is a heatsink formed of thermally conductive material, and
  at least one LED on the external component layer, the external component layer facing transaxially outwardly from the housing such that light emitting from the LED emits from the light head section,
  wherein the housing comprises longitudinal grooves trapping longitudinal edges of the substrate layer to hold the substrate layer in thermal contact with the housing.

8. The work light of claim 7 wherein a layer of the LED circuit board assembly other than the substrate layer is between the substrate layer and the housing, such layer is electrically resistive with low thermal resistance.

9. The work light of claim 7 wherein the substrate is formed of metal and the LED circuit board assembly is a metal core LED circuit board assembly.

10. The work light of claim 9 wherein the housing is a single-piece unit.

11. A work light comprising:
a work light body including,
  a handle section and a light head section,
  an elongate housing extending through the handle section and the light head section,
  an LED circuit board assembly having a substrate layer and an external component layer on a side of the substrate layer, the substrate layer formed of a thermally conductive material, the substrate layer is in thermal contact with the housing, and the housing is a heatsink formed of thermally conductive material, and
  at least one LED on the external component layer, the external component layer facing transaxially outwardly from the housing such that light emitting from the LED emits from the light head section,
  wherein a layer of the LED circuit board assembly other than the substrate layer is between the substrate layer and the housing, such layer is electrically resistive with low thermal resistance.

12. The work light of claim 7 wherein a layer of the LED circuit board assembly other than the substrate layer is between the substrate layer and the housing, such other layer is electrically resistive with low thermal resistance.

13. The work light of claim 12 further comprising a driving component layer on an opposing side of the substrate layer, and at least one driving component on the driving component layer.

* * * * *